(12) United States Patent
Kitagawa et al.

(10) Patent No.: US 9,093,147 B2
(45) Date of Patent: Jul. 28, 2015

(54) METHOD AND APPARATUS FOR COMMON SOURCE LINE CHARGE TRANSFER

(71) Applicant: Sony Corporation, Tokyo (JP)

(72) Inventors: Makoto Kitagawa, Folsom, CA (US); Wataru Otsuka, Boise, ID (US); Takafumi Kunihiro, Boise, ID (US); Tomohito Tsushima, Boise, ID (US)

(73) Assignee: Sony Corporation, Tokyo (JP)

( * ) Notice: Subject to any disclaimer, the term of this patent is extended or adjusted under 35 U.S.C. 154(b) by 36 days.

(21) Appl. No.: 13/907,014

(22) Filed: May 31, 2013

(65) Prior Publication Data

US 2014/0355329 A1 Dec. 4, 2014

(51) Int. Cl.
*G11C 11/00* (2006.01)
*G11C 13/00* (2006.01)

(52) U.S. Cl.
CPC ........ *G11C 13/0069* (2013.01); *G11C 13/0011* (2013.01); *G11C 2013/0092* (2013.01); *G11C 2213/79* (2013.01); *G11C 2213/82* (2013.01)

(58) Field of Classification Search
USPC ................................. 365/148, 158
See application file for complete search history.

(56) References Cited

U.S. PATENT DOCUMENTS

| 2012/0020141 A1* | 1/2012 | Kitagawa et al. ............. 365/148 |
| 2013/0242641 A1* | 9/2013 | Nakai ........................... 365/148 |

OTHER PUBLICATIONS

K. Aratani, et al., A Novel Resistance Memory with High Scalability and Nanosecond Switching; Solid State Memories Research Laboratory, Information Technologies Laboratories, Sony Corporation, 3 pages.
Wataru Otsuka, et al., ISSCC2011/Session 11/Non-Volatile Memory Solutions/11.7—A 4Mb Conductive-Bridge Resistive Memory with 2.3GB/s Read-Throughput and 216MB/s Program-Throughput; 2011 IEEE International Solid-State Circuits Conference; Dec. 4, 2010; pp. 20-21.

* cited by examiner

*Primary Examiner* — Anthan Tran
(74) *Attorney, Agent, or Firm* — Moser Taboada

(57) ABSTRACT

A method and apparatus for charge transfer comprising a resistive random access memory (ReRAM) cell, coupled to a common source voltage line (CSL) for controlling state of the ReRAM cell, and a charge transfer circuit, coupled to the memory cell through the CSL and a charge consumption circuit, for transferring charge from the CSL to the charge consumption circuit when the state of the memory cell is modified.

14 Claims, 5 Drawing Sheets

METHOD AND APPARATUS FOR COMMON SOURCE LINE CHARGE TRANSFER

FIELD

Certain embodiments of the disclosure relate to resistive random access memory. More specifically, certain embodiments of the disclosure relate to a method and apparatus for common source line charge transfer.

BACKGROUND

The growing demand for high performance data storage and access in various consumer electronic and computing devices has driven the development of nonvolatile memory (NVM) technologies. Resistive random access memory (ReRAM) is one of alternative NVMs used because of its low operating voltage, high speed and scalability. ReRAM is employed in computers, mobile computing devices, memory cards, and the like. For more information regarding ReRAM, please see commonly assigned U.S. Pat. No. 6,867,996, hereby incorporated by reference in its entirety.

A ReRAM module is composed of a plurality of memory tiles. Each of the memory tiles further comprises an array of memory cells. The memory cells each represent a "bit" in memory. Each memory cell comprises, minimally, a transistor coupled to a resistive material, further coupled to a common source line voltage (CSL). The transistor is further coupled to a bit-line and a word-line. A bit is modified in the memory cell based on the direction bias across the memory cell. For example, the "set" operation sets a high resistance to a low resistance in the resistive material of the memory cell. A "reset" operation has the polarity of the direction bias reversed, setting a low resistance to a high resistance in the resistive material of the memory cell.

However, due to the small size of the memory tile in a ReRAM module and the large number of cells in each memory tile, the CSL tends to accumulate a large parasitic capacitance. The large parasitic capacitance can generate parasitic oscillations in the ReRAM module, increases the rise and fall times of digital pulse signals for selecting and modifying memory cells, and can cause other unwanted side effects in the circuit resulting in undesired and excessive power usage.

Therefore, there is a need in the art to prevent the unwanted side effects of the large parasitic capacitance in the CSL of ReRAM modules.

SUMMARY

An apparatus and/or method is provided for common source line charge transfer substantially as shown in and/or described in connection with at least one of the figures, as set forth more completely in the claims.

These and other features and advantages of the present disclosure may be appreciated from a review of the following detailed description of the present disclosure, along with the accompanying figures in which like reference numerals refer to like parts throughout.

DETAILED DESCRIPTION

Certain implementations of the invention may be found in an apparatus and/or method for common source line charge transfer in a ReRAM module. According to one embodiment, a charge transfer circuit is coupled to the common source line of the memory array. The large capacitance of the common source line is coupled to the charge transfer circuit, and the charge transfer circuit consumes the excess charge as current, therefore discharging the common source line.

Figure 1:
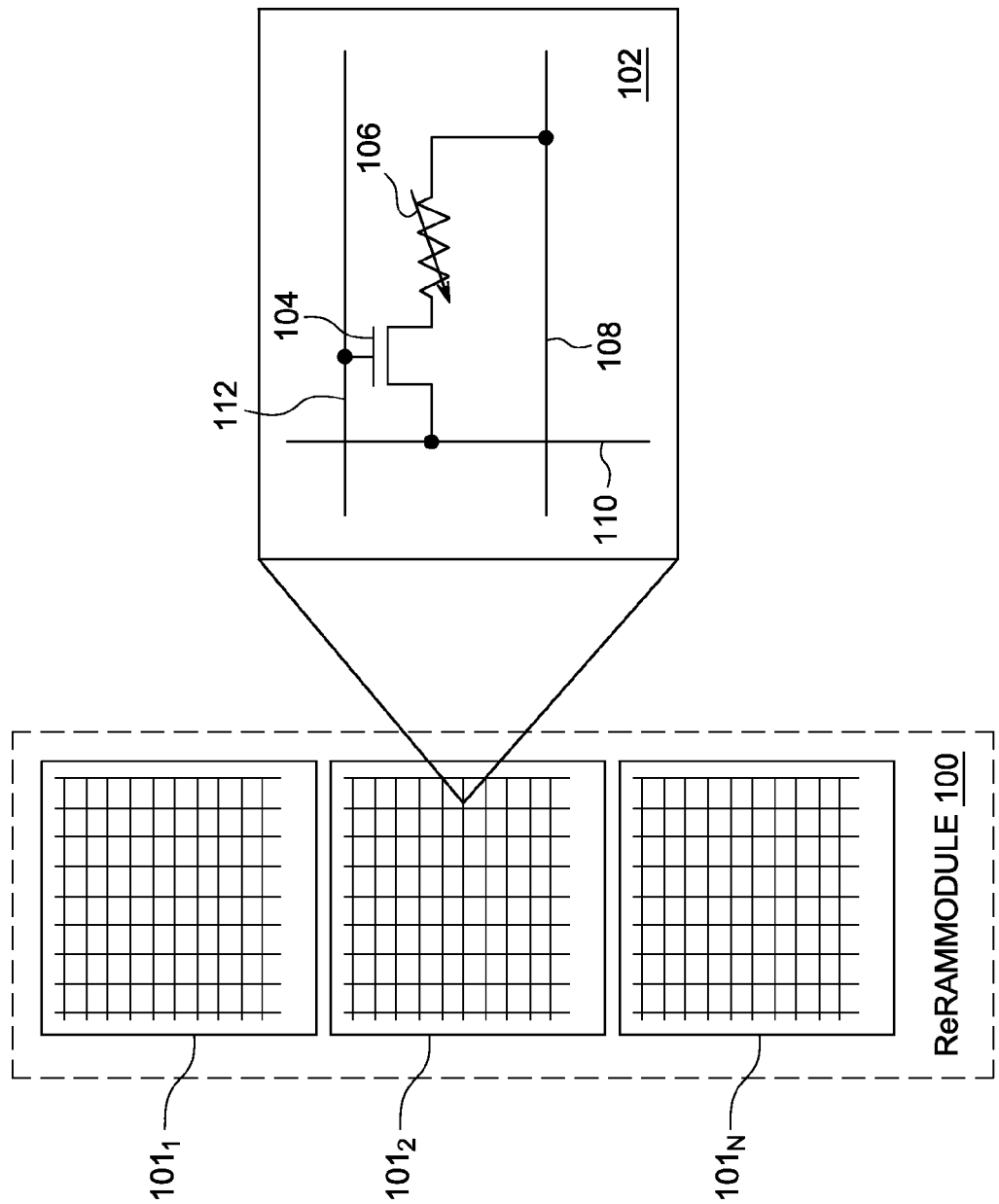
FIG. 1 is a depiction of a memory tile in an ReRAM module according to the reference art.

To understand the structure of the ReRAM module of the present invention, a ReRAM module of the background art will be described for purposes of comparison. FIG. 1 is a depiction of a ReRAM module 100 according to the background art. The ReRAM module 100 comprises a plurality of memory tiles $101_1$ to $101_n$ (where n is an integer). The memory tile $101_2$, for example, comprises an array of m memory cells (where m is an integer), one of which is memory cell 102. The memory cell 102 is an exemplary depiction of one of the memory cells of the array of memory cells on the memory tile 101. The memory cell 102 comprises a switch 104 coupled to a variable resistance material (R) 106.

The gate of the switch 104 is coupled to the word line (WL) 112. The source of the switch 104 is coupled to the bit line (BL) 110. R 106 is further coupled to the common source line (CSL) 108. The CSL 108 is common to all memory cells within the memory tile 101, i.e., all variable resistance materials in each cell are coupled to the CSL 108. According to some embodiments, R 106 comprises Dual-layered conductive bridge elements that employ Copper Tellurium (CuTe) based conductive material and Gadolinium Oxide (GdOx) thin insulators.

R 106 can occupy a high resistance state (HRS) or a low resistance state (LRS), corresponding to whether the memory cell 102 is considered "on" or "off". R 106 comprises top and bottom electrodes and allows bipolar switching where a HRS turns into a LRS when the top electrode is positively biased and turning a LRS state to a HRS state when the bottom electrode is positively biased. The top electrode forms a plate covering half of the memory cell 102, for example. Bringing the resistance of R 106 from HRS to LRS is defined as a "SET" operation. Bringing the resistance of R 106 from LRS to an HRS is defined as "RESET" operation on the memory cell 102.

In an idle state (no SET or RESET operation) of the memory cell 102, CSL 108, BL 110 and WL 112 are grounded to reduce the current (i.e., are at a LOW voltage state ~0V). Once a RESET operation is invoked, BL 110 and WL 112, which have low parasitic capacitance, are set to a HIGH voltage (for example, 5V) while CSL 108 remains at a stable voltage, i.e. 0V. Varying BL 110 and WL 112 requires a small amount of energy because BL and WL are only common to cells along the direction of the BL and WL, i.e., they have a low capacitance. For a RESET operation, only a small amount of energy is expended because only BL 110 and WL 112 are modified.

However, moving from an idle state to a SET operation (using a SET pulse), initially CSL 108 is set to a HIGH voltage state, BL 110 must be set to a HIGH voltage state, while WL is in a LOW voltage state. Next, during the SET operation, WL is also set to a HIGH voltage state, due to a voltage offset between CSL 108 and the BL 110.

Subsequently, during the SET operation, BL 110 is set to a LOW voltage state, while CSL 108 and WL 112 remain HIGH. After the completion of the SET pulse, the CSL 108, BL 110 and WL 112 are all set to idle state conditions, i.e., CSL 108, BL 110 and WL 112 are grounded. However, in the background art depicted in FIG. 1, because of the large parasitic capacitance accumulated in CSL 108, grounding CSL 108 involves discharging CSL 108, requiring a large amount of power usage. Since the ReRAM module is generally used in low power mobile device, these devices are negatively impacted by large power consumption.

Figure 2:
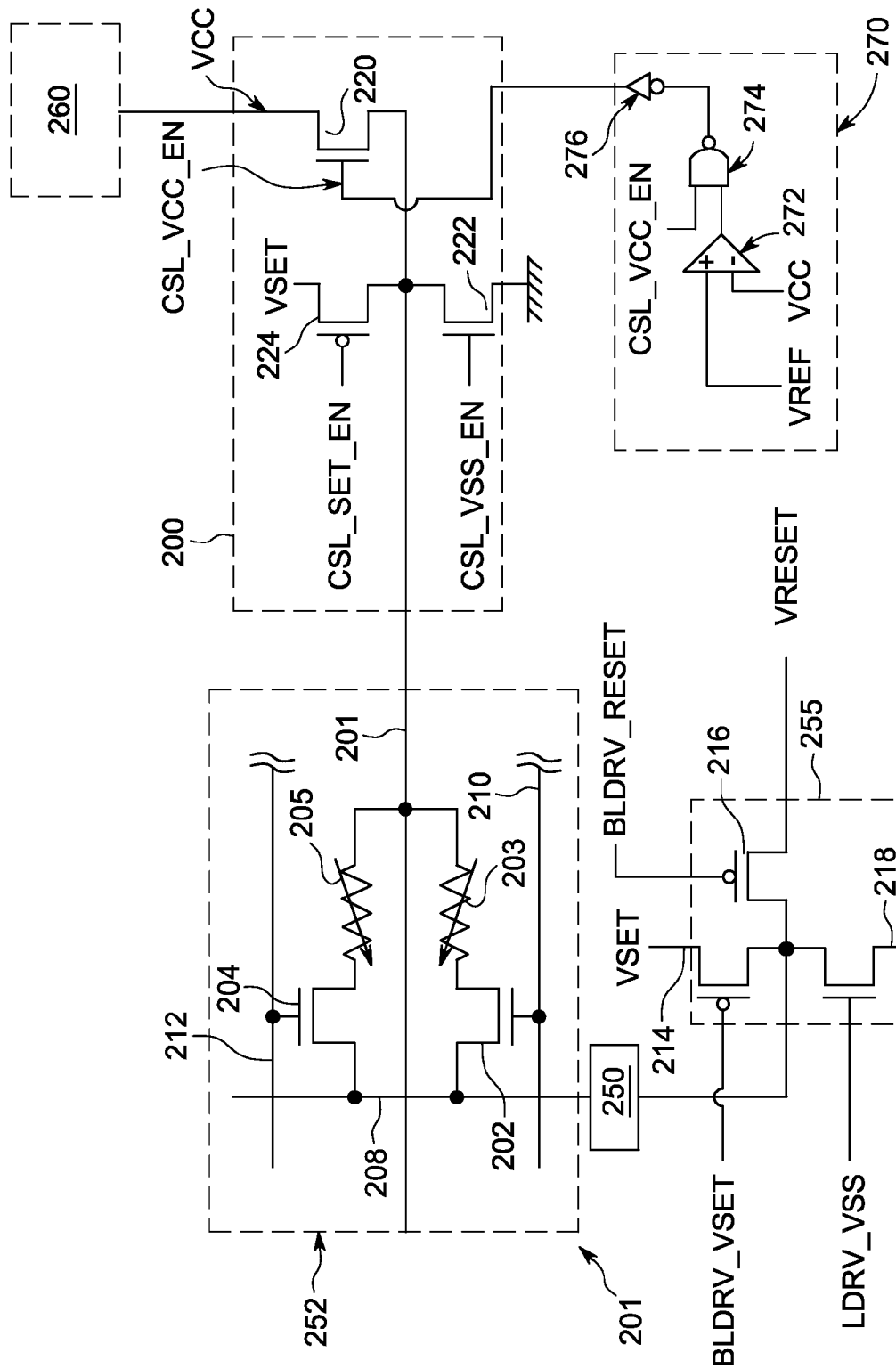
FIG. 2 is a depiction of a charge transfer circuit in accordance with exemplary embodiments of the present invention.

FIG. 2 is a depiction of a charge transfer circuit 200 in accordance with exemplary embodiments of the present invention, coupled to two memory cells 201 and 252. Two memory cells are depicted in FIG. 2 to show the commonality of the common source line 201. The charge transfer circuit 200 comprises a first switch 220, a second switch 222 and a third switch 224, for consuming the capacitance accumulated in the CSL 201 coupled to a first memory cell 201 and a second memory cell 253 as current to supply to a charge consumption circuit 260. According to an exemplary embodiment of the present invention, the charge consumption circuit (CCC) 260 may be any other circuit of the ReRAM module coupled at the source of switch 220. According to an exemplary embodiment, the CCC 260 may comprise any circuit in the ReRAM module.

According to one example, 500 pF of capacitance is accumulated on the CSL 201, VSET is 3V and VCC is 1V. VSET is the voltage at the source of switch 214 and VCC is the voltage of the CCC 260. CCC normally consumes 5 mA and the CSL 201 charge-discharge cycle is 1 µs. In this example, the charge from the CSL 201 can be transferred to the CCC 260 according to: 500 pF*(3V−1V). The current deduced from the CSL 201 will then be 500 pF*(3V−1V)/1 µs=1 mA. The 1 mA is used for VCC current consumption. Accordingly, the actual current consumption of CCC 260 (5 mA−1 mA)=4 mA.

The memory cell 201 comprises a switch 202 coupled to a resistive element 203 and the memory cell 253 comprises a switch 204 coupled to a resistive element 205. Each of the memory cells 201 and 253 behave similarly, and the operation of memory cell 201 will be described below. In the following discussion HIGH refers to a high voltage level, for example, 5V or 3V, whereas LOW refers to a low voltage level, for example, 0V. According to other embodiments, other voltages may be used, as known to those of ordinary skill in the art.

For memory cell 201, the gate of the switch 202 is coupled to the word line 0 (WL0) 210. The source of switch 202 is coupled to the bit line (BL) 208. The resistive element 203 is coupled to the common source line 201, which, according to an exemplary embodiment is at 0V in an idle state. In memory cell 253, the gate of the switch 204 is coupled to the word line 1 (WL1) 212. The source of switch 204 is coupled to the bit line (BL) 208. The resistive element 205 is also coupled to the common source line 201. Accordingly, it can be seen that the memory cell 201 and the memory cell 253 share the CSL 201 as well as the BL 208, but are coupled to two different word lines, WL0 210 and WL1 212, respectively. The BL 208 is only shared across memory cells arranged in a particular memory tile, but the CSL 201 is shared across all memory cells and memory tiles contained in a ReRAM module.

Figure 3:
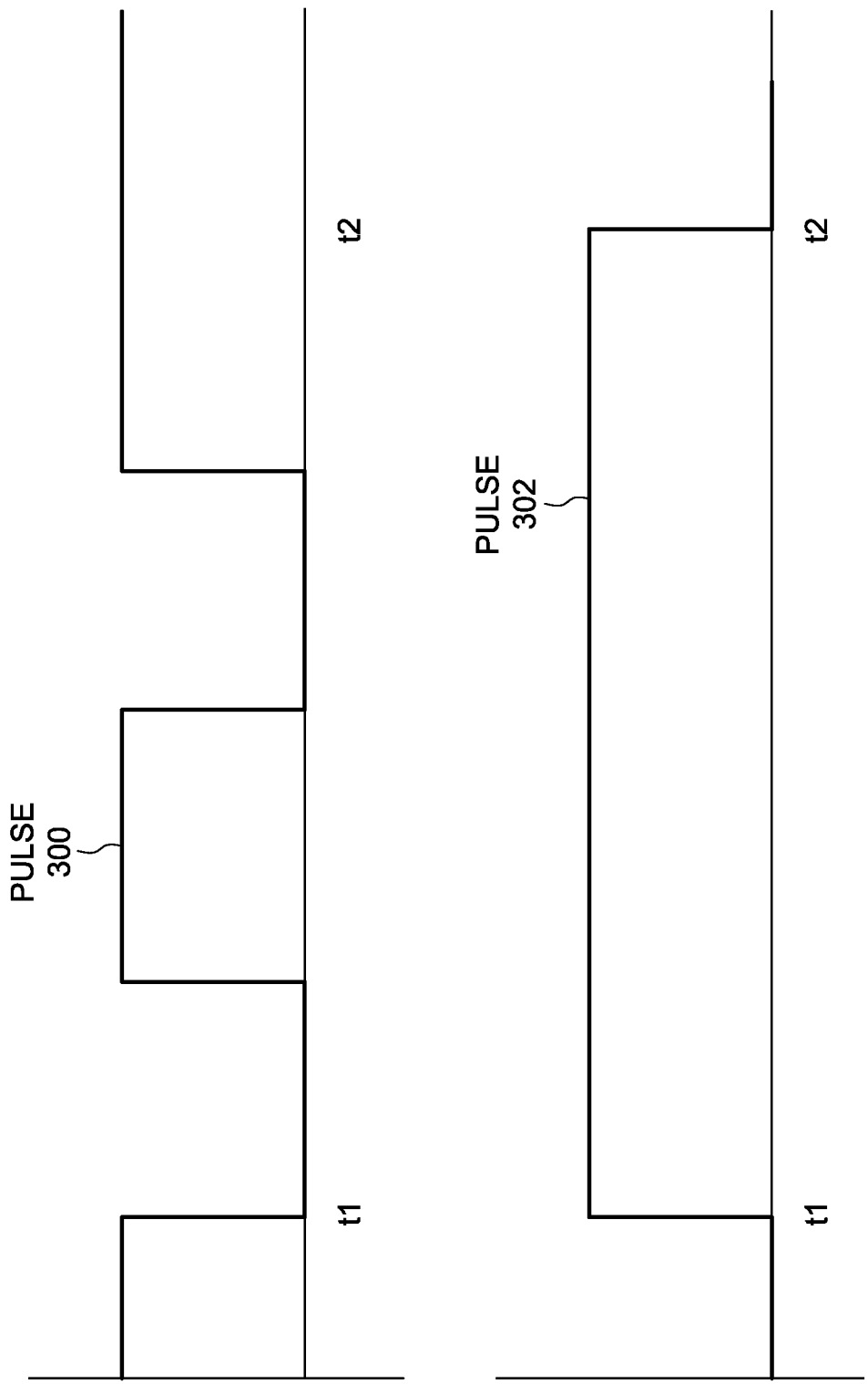
FIG. 3 is an illustration of SET and RESET pulses as applied to the memory cell in accordance with exemplary embodiments of the present invention.

The BL 208 is further coupled to a multiplexer (MUX) 250 for selecting the memory cell within a memory tile, and applying a pulse as shown in FIG. 3, respectively as pulse 302 and 304. The MUX 250 is coupled to the BL control circuit 255. Specifically, the MUX 250 is coupled to the source/drain terminals of switch 214, switch 216 and switch 218 of the BL control circuit 255. According to an exemplary embodiment of the present invention, switch 214 and switch 216 are PMOS switches and switch 218 is an NMOS switch.

The switch 218 is couple to ground at the drain. The switch 214 and 218 drive the BL 208 from VSET (i.e., 3V) to VSS (ground voltage ~0V). The switch 216 is coupled to a VRESET voltage at the source of switch 216. The gate of the switch 216 is coupled to BLDRV_VRESET, a RESET voltage source. The switches 214, 216 and 218 are connected in parallel.

The voltage VSET is higher than the voltage VCC because VSET is used to operate memory cell 201 and memory cell 253. For example, VSET may be 3V, and VCC may be 1V. VCC is required for the logic operation of the charge transfer circuit 200; specifically, switches 220, 222 and 224. According to one embodiment the BLDRV_VSET (a SET voltage source) is input the SET pulse 300 as shown in FIG. 3 to set the memory cell 201 from idle state or the RESET pulse 302 to reset the memory cell to idle state. The SET operation is described in more detail with respect to FIG. 5 below.

A charge transfer control circuit 270 can optionally be coupled to charge transfer circuit 200 to detect whether the capacitance from CSL 201 is too high for the charge consumption circuit 260 of FIG. 2. If the capacitance from CSL 201 is excessive, the circuit 270 cuts off the charge transfer from CSL 201 to the CTC 260 via the charge transfer circuit 200 to prevent damage to the CTC 260.

For example, charge consumption circuit 260 is expected to remain below a certain voltage threshold, for example, 1.2V. If the amount of current consumption of the charge consumption circuit VCC is less than the charge from CSL 201, the voltage consumed by the charge consumption circuit 260, VCC, will exceed the threshold value, and the circuit 270 prevents the charge from being transferred from CSL 201 to the charge consumption circuit 260.

The gate of the switch 220 is coupled to the circuit 270. The circuit 270 determines if VCC is greater than VREF. If VCC is greater than VREF, the charge transfer is prevented by opening the switch 220 by applying a LOW voltage at the gate of switch 220.

The circuit 270 is comprised of an operational amplifier (op amp) 272, a NAND logic gate 274 and an inverter 276. The op amp 272 compares VREF and VCC to determine if VCC is greater than VREF (for example, 1.2V). If VREF is greater than VCC, the op amp 272 output goes to HIGH. The NAND gate 274 takes the HIGH as input, and CSL_VCC_EN as input. Since one input of the NAND gate 274 is HIGH and CSL_VCC_EN is high, the output of the NAND gate 274 is LOW. The inverter 406 inverts the output to HIGH, which in turn is coupled to the gate of switch 220, causing the switch 220 to close, coupling VCC to CSL 201 and allowing the charge transfer.

However, if VCC is greater than VREF, the op amp 272 goes to LOW. The NAND gate 274 takes the LOW as input and CSL_VCC_EN as input. Since CSL_VCC_EN is HIGH, the NAND gate 274 outputs HIGH to the inverter 276. The inverter 276 inverts the input and outputs a LOW signal to the gate of switch 220. A LOW signal at gate 220 opens the gate 220, decoupling VCC from CSL 201, and preventing the CSL 201 charge transfer to VCC.

Figure 4:
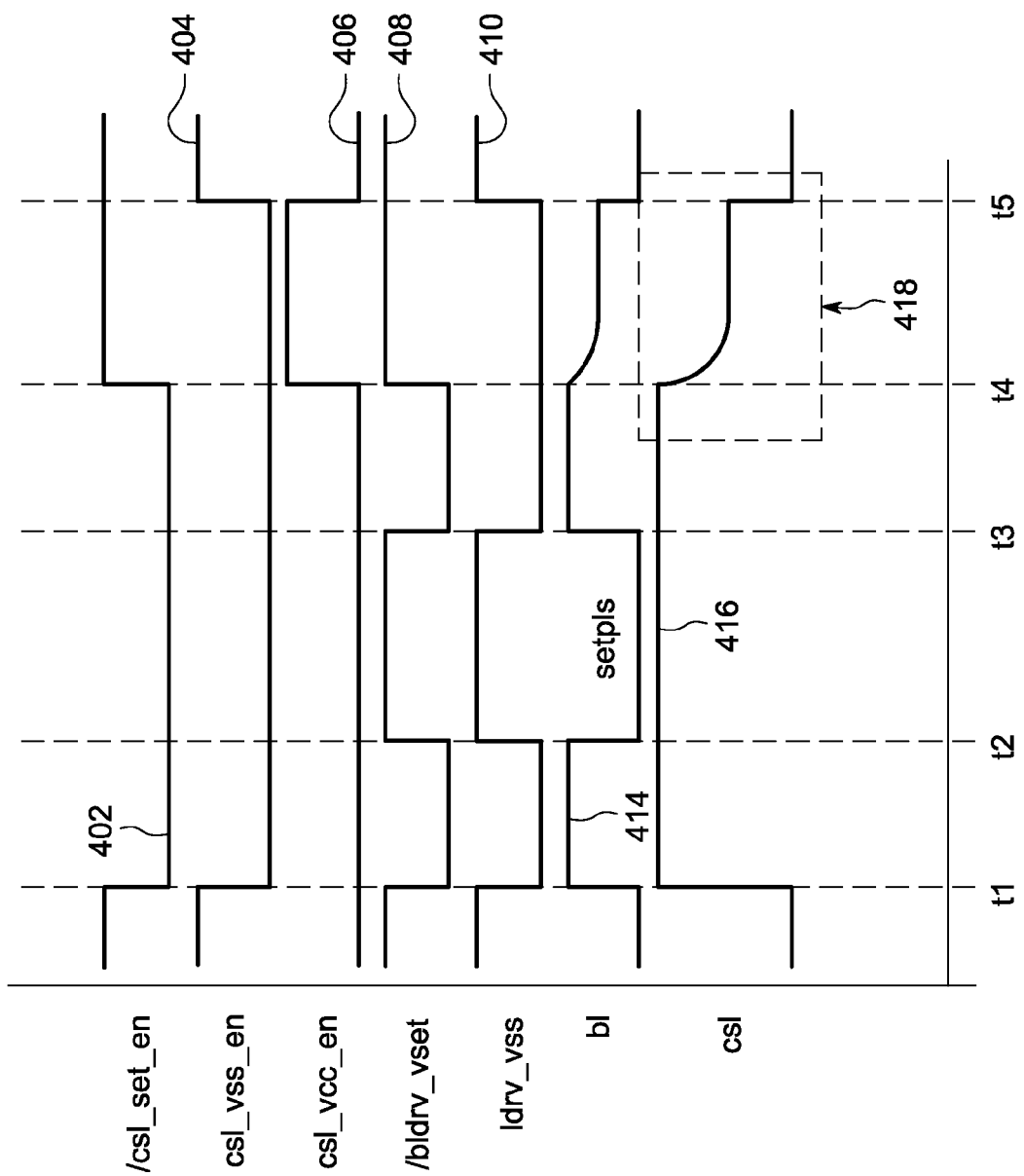
FIG. 4 is a depiction of a SET pulse according to exemplary embodiments of the present invention.

FIG. 4 is an illustration of the pulse outputs and inputs at various points in the memory cell 201 as shown in FIG. 2 for a SET operation. Pulse 402 is the CSL_SET_EN pulse applied at the gate of switch 224. Pulse 404 is the CSL_VSS_EN pulse at the gate of switch 222. Pulse 406 is the CSL_VCC_EN pulse at the gate of the switch 220, i.e. this is the gate voltage between VCC and CSL 201. In the present invention, when CSL 201 is discharged at region 518, the discharge initially goes to the VCC circuit, depicted by the CSL_VCC_EN going high at point t4.

Pulse 408 is the BLDRV_VSET pulse applied at the gate of switch 214. Pulse 410 is the LDRV_VSS pulse at the gate of switch 218. Pulse 412 is the pulse applied to the BL 208. Pulse 414 is the pulse applied at the CSL 201. Note that instead of a sharp cut-off in region 418, there is a smoothed current consumption, i.e., the charge of the CSL 201 is transferred to VCC.

In order to perform a SET operation, CSL_SET_EN 402 and CSL_VSS_EN 404 control the CSL pulse 516, i.e., set CSL 201 to VSS (ground voltage) or VSET (i.e., 3V). At time t1, CSL_SET_EN 402, CSL_VSS_EN 404, BLDRV_VSET 406 and LDRV_VSS 408 go LOW in order to make BL 208 and CSL 201 go HIGH. At time t2, BLDRV_VSET and LDRV_VSS go to HIGH, in order to make BL 208 go to LOW.

At time t3, BLDRV_VSET and LDRV_VSS go to LOW to make the BL 208 go HIGH. At time t4, BLDRV_VSET goes to HIGH, while LDRV_VSS stays LOW, causing CSL pulse 416 to transfer charge from CSL 201 to VCC, i.e., CSL_VCC_EN, pulse 406. Finally, at time t5, LDRV_VSS goes to HIGH while BLDRV_VSET remains HIGH to return BL 208 to LOW.

Figure 5:
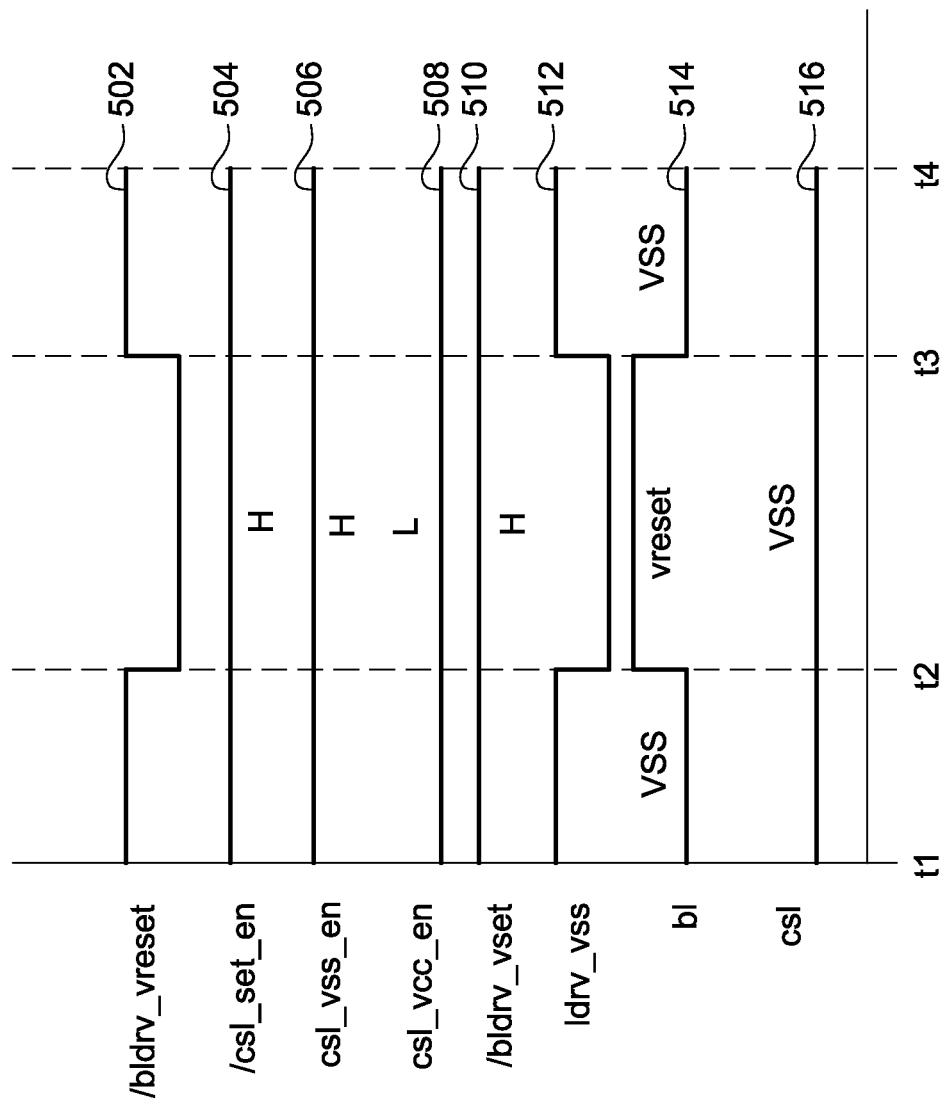
FIG. 5 is a depiction of a RESET pulse according to exemplary embodiments of the present invention.

The control voltage CSL_SET_EN is applied to the gate of switch 224 to control operation of switch 224. The control voltage CSL_VSS_EN is applied to the gate of switch 222 to control operation of switch 222. If the pulse at the gate of switch 224 is initially HIGH and the pulse at the gate of switch 222 is initially HIGH (as shown in FIG. 5), the switch 224 will be closed and the switch 222 will be open causing the memory cell 201 to be operated with the voltage VSET. After the SET operation, switch 222 allows the memory cell 201 to return to an idle state by setting CSL_VSS_EN to HIGH, closing switch 222 and coupling CSL 201 to ground. According to an exemplary embodiment of the present invention, switch 224 is a PMOS switch, switch 222 is an NMOS switch and switch 220 is an NMOS switch.

However, when CSL_VCC_EN goes HIGH, CSL_VSS_EN also goes LOW. CSL_SET_EN is then HIGH, causing the switch 220 to be open. CSL_VCC_EN is the gate voltage between VCC and CSL. The circuit 260 therefore consumes the current generated from the CSL 201 capacitance.

FIG. 5 is a depiction of a RESET pulse according to exemplary embodiments of the present invention. According to FIG. 5, when BLDRV_VRESET pulse 502 goes LOW, BL 208 (shown as BL pulse 514) is coupled from VSS to VRESET through the open switch 216, and the RESET direction bias will be applied to the memory cell 201 (while pulse BLDRV_VSET 510 is HIGH).

The control voltage CSL_SET_EN pulse 504 is applied to the gate of switch 224 to control operation of switch 224. The control voltage CSL_VSS_EN pulse 506 is applied to the gate of switch 222 to control operation of switch 222. If the pulse at the gate of switch 224 is initially HIGH and the pulse at the gate of switch 222 is initially HIGH (as shown in FIG. 5), the switch 224 will be closed and the switch 222 will be open causing the memory cell 201 to be operated with the voltage VSET. During the RESET operation, switch 222 allows the memory cell 201 to return to an idle state by setting CSL_VSS_EN pulse 506 to HIGH, closing switch 222 and coupling CSL 201 (shown as pulse 516) to ground. According to an exemplary embodiment of the present invention, switch 224 is a PMOS switch, switch 222 is an NMOS switch and switch 220 is an NMOS switch.

When CSL_VCC_EN pulse 508 goes LOW, CSL_VSS_EN goes HIGH. CSL_SET_EN pulse 504 is then HIGH, causing the switch 222 to be open, therefore coupling the CSL 201 to ground. The circuit 260 therefore does not perform any current transfer to the CCC 260 n. LRDV_VSS pulse 512 is HIGH at time t1, goes to LOW at time t2, and remains at LOW until time t3. At time t3, LDRV_VSS then goes to HIGH again.

While the present disclosure has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiment disclosed, but that the present disclosure will include all embodiments falling within the scope of the appended claims.

What is claimed is:

1. An apparatus for charge transfer comprising:
    a resistive random access memory (ReRAM) cell, coupled to a common source voltage line (CSL) for controlling state of the ReRAM cell; and
    a charge transfer circuit, coupled to the memory cell through the CSL and a charge consumption circuit, for transferring charge from the CSL to the charge consumption circuit when the state of the memory cell is modified, the charge transfer circuit comprising:
        a first switch coupled to the CSL at a drain of the first switch and coupled to the charge consumption circuit with a voltage VCC at a source of the first switch;
        a second switch having a drain coupled to the CSL; and
        a third switch having a source coupled to the CSL, and a drain coupled to ground.

2. The apparatus of claim 1 wherein the voltage at the source of the third switch is greater than the voltage at the source of the first switch.

3. The apparatus of claim 1 further comprising:
    a charge transfer control circuit coupled at a gate of the third switch for preventing an excessive charge from being transferred to the charge consumption circuit.

4. The apparatus of claim 1 wherein the VCC is approximately 1V.

5. The apparatus of claim 3, wherein the charge transfer control circuit comprises:
    an operational amplifier (op amp) taking as input, a reference voltage and VCC;
    a NAND gate, coupled to the op amp, taking as input, an output of the op amp and a control signal for the third switch; and
    an inverter, for inverting an output of the NAND gate.

6. The apparatus of claim 5 where the reference voltage is approximately 1.2V.

7. The apparatus of claim 1,
    wherein the first switch is an NMOS transistor, the second switch is a PMOS transistor and the third switch is a PMOS transistor.

8. The apparatus of claim 7 wherein the source of the first switch is coupled to a voltage VSET for a SET operation and the drain of the second switch is grounded.

9. The apparatus of claim 8 wherein VSET is approximately 3V.

10. The apparatus of claim 1 wherein the charge is accumulated by a parasitic capacitance of the CSL.

11. The apparatus of claim 1 further comprising:
a multiplexer coupled to the memory cell; and
a bit-line control circuit coupled to the multiplexer, for setting or resetting the memory cell.

12. The apparatus of claim 11 further comprising:
wherein the bit-line control circuit comprises a first transistor, a second transistor and a third transistor coupled in parallel to the multiplexer.

13. The apparatus of claim 12 further comprising:
wherein the first transistor is a PMOS transistor, the second transistor is a PMOS transistor, and the third transistor is an NMOS transistor.

14. The apparatus of claim 13 further comprising:
wherein a gate of the first transistor is coupled to a first pulse for a SET operation of the memory cell and the source of the first transistor is coupled to a voltage VSET, a gate of the second transistor is coupled to a second pulse for a RESET operation of the memory cell and the source of the second transistor is coupled to a voltage VRESET, and a gate of the third transistor is coupled to a third pulse and the drain of the third transistor is coupled to ground and,
wherein a drain of the first transistor is coupled to the drain of the second transistor, further coupled to the source of the third transistor.

\* \* \* \* \*